US008645894B1

(12) United States Patent
Kukal et al.

(10) Patent No.: US 8,645,894 B1
(45) Date of Patent: Feb. 4, 2014

(54) CONFIGURATION AND ANALYSIS OF DESIGN VARIANTS OF MULTI-DOMAIN CIRCUITS

(75) Inventors: Taranjit Singh Kukal, Delhi (IN); Amit Chopra, Uttar Pradesh (IN); Raja Vitra, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 1270 days.

(21) Appl. No.: 12/166,730

(22) Filed: Jul. 2, 2008

(51) Int. Cl.
*G06F 17/50* (2006.01)
(52) U.S. Cl.
USPC ........... 716/136; 716/100; 716/106; 716/110; 716/111
(58) Field of Classification Search
USPC .................. 716/100, 106–108, 110–111, 136
See application file for complete search history.

(56) References Cited

U.S. PATENT DOCUMENTS

| 5,629,857 | A | * | 5/1997 | Brennan | 716/139 |
| 6,298,468 | B1 | * | 10/2001 | Zhen | 716/122 |
| 6,449,761 | B1 | * | 9/2002 | Greidinger et al. | 716/122 |
| 2003/0004699 | A1 | * | 1/2003 | Choi et al. | 703/14 |
| 2005/0172252 | A1 | * | 8/2005 | Cheng et al. | 716/10 |
| 2005/0278665 | A1 | * | 12/2005 | Gentry et al. | 716/4 |

* cited by examiner

*Primary Examiner* — Paul Dinh
(74) *Attorney, Agent, or Firm* — Rosenberg, Klein & Lee

(57) ABSTRACT

A circuit design system generates a circuit variant by relocating one or more circuit elements through a user move action on a user interface. When the user move action results in the circuit element traversing a circuit domain boundary, the design system performs one or more operations to form the circuit variant having its initial connectivity with the relocated circuit element without any other user action on the user interface than the user move action. Further, in response to no other action on the user interface than the user move action, analysis tools and reports are initiated so that rapid evaluation of circuit variants may be implemented.

9 Claims, 13 Drawing Sheets

CONFIGURATION AND ANALYSIS OF DESIGN VARIANTS OF MULTI-DOMAIN CIRCUITS

BACKGROUND OF THE INVENTION

1. Field of the Invention

The present general inventive concept is related to circuit design apparatuses and circuit design methodologies of circuit designs formed of physically divided sub-circuits. More specifically, the present general inventive concept affords a circuit designer with design tools to rapidly configure and analyze variants of a circuit design created by moving one or more selected circuit elements represented in a user interface across a boundary separating sub-circuits of the circuit design.

2. Description of the Related Art

As design trends of electronic circuits tend toward more compact circuitry, circuit designers rely more heavily on separating large, complex circuits into separate domains, such as through separations of functionality or fabrication process. For example, although various radio-frequency (RF) circuit designs can be physically implemented as a System-on-Chip (SoC), whereby the entire circuit is formed on a single circuit-bearing medium such as silicon, certain performance criteria require many RF circuit designs to be implemented as a System-in-Package (SiP), whereby various sub-circuits are respectively realized on separate circuit-bearing media. While the SoC implementation incorporates the necessary passive components on the circuit-bearing medium itself, typically on a silicon die, such implementations are also very costly and are characterized by a low quality-factor (Q). Alternatively, the circuit may be implemented as a SiP to separate the passive components from the silicon die, and, instead, the passive components are integrated on an inexpensive and high quality package substrate. However, separating the passive components in this manner comes with a whole new set of challenges and disadvantages, such as, for example, performance degradation due to parasitic effects from the packaging interfaces between the passive components and the circuit on the silicon die, reduction in yield due to relatively large process variations in packaging as compared with integrated circuit technology, and counteracting any savings of chip area achieved by relocating the passive components from the die by the addition of extra input/output (I/O) pads on the silicon die to connect with the exterior passive components.

Design decisions as to whether passive components should be constructed on a circuit-bearing medium separate from the die, referred to as off-chip, or fabricated on the silicon die, or on-chip, are typically made based on analysis of several important metrics, such as cost and performance (gain, noise and linearity) of the resulting system and ability of the design to tolerate fabrication process variations. Such analysis can be performed through simulation of modeled variants of the RF-SiP design, where such variants are created by changing the placement of passive components in the design environment, and evaluating the performance of the corresponding circuit model. The change in component placement may be localized within the die itself or within the off-chip substrate itself, or across die and off-chip substrate, or across dies within the SiP design. Whereas it is quite intuitive and thus easy for a designer to choose the placement of a high value passive component as off-chip and common value passive component as on-chip, the same is neither intuitive nor easy when the passive component has neither a common value nor a high value.

The conventional approach to construct RF-SiP design variants and analyze their respective performances involves a large number of manual steps in not only the SiP/IC design flow, but in the simulation flow as well. Consequently, the process of creating and analyzing even a small number of circuit variants is not only very time consuming, but prone to error. Moreover, the number of manual operations to create and analyze circuit variants increases with the number of passive components being considered for the on-chip vs. off-chip trade-off. Any unsatisfactory performance of a SiP variant would cause the designer to repeat all of the previously performed steps: changing SiP and IC die schematics to create variants, generating a floor-plan and estimating silicon area for each die variant, generating the die footprint to be used in the off-chip substrate layout for each variant, generating the floor-plan for each off-chip circuit variant, extracting the relevant portion of the design impacted by way of moving the component to simulate the performance of the circuit responsive to the move, and performing tradeoff analysis by comparing the simulation results of the variants.

FIG. 1 illustrates basic steps to move a passive component across a boundary of a die circuit and an external off-chip substrate, and to perform the subsequent analysis on the resulting variant. In summary, the operations illustrated in the flow diagram of FIG. 1 include: editing the schematic of the die circuit to delete or add the passive component, changing the die interfaces accordingly, generating/updating the die floor-plan based on the edited schematic to determine die placement and to estimate the required area, creating the die footprint and die symbol, e.g., using the updated die boundary and interface information to create the die footprint and symbol to be used in off-chip design, editing the off-chip schematic to add or delete the passive component, deleting the original die symbol and adding the newly created symbol, updating the connectivity using the new interface, generating/updating the off-chip floor-plan from the off-chip schematic, extracting the portion of the circuit design that tests the efficacy of moving the component, manually creating a new schematic for the critical portion of the design by performing trial simulations to ensure all related components are copied into the test model, creating a simulation netlist for the off-chip design, ensuring the model binding is to the correct fabrication technology, inserting the parasitic models of the die interface and passive component connections into the off-chip netlist based on placement and stack-up, simulating and analyzing the variant test-bench, and repeating the foregoing operations for every move of a candidate component from off-chip to on-chip, and vice-versa, until a decision is made.

As is apparent from the flow diagram of FIG. 1, the large number of steps and overall complexity of performing conventional trade-off analysis renders the entire process unmanageable, inefficient, and costly. The large number of steps to create a variant restricts the designer to attempt only a limited number of combinations, thereby resulting in non-optimal and inefficient trade-off analysis.

In the absence of sufficient tools to assist in rapid quantitative analysis of the performance of the circuit, RF circuit designers often have difficulty in making a choice with respect to the placement of the passive components in an RF design. These illustrative RF design difficulties are in fact indicative of shortcomings in the much broader field of general circuit design and analysis, namely creating and analyzing circuit variants in a seamless manner. Accordingly, there is an apparent need for a unified system and method that allows easy and rapid performance analysis of variants of circuits formed from components that can be distributed across more than one circuit-bearing medium.

SUMMARY OF THE INVENTION

The present general inventive concept provides an apparatus and concomitant processes to configure and analyze variants of multi-domain circuit designs through minimal user actions on a user interface.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an apparatus to evaluate variants of a circuit design. The apparatus includes a database to store circuit data that realizes a circuit on at least one circuit-bearing medium, a user interface to respond to a user action to relocate at least one circuit element across a circuit domain boundary defined on the circuit-bearing medium, and a circuit data processor to modify the circuit data in response to no other user action on the user interface than the user action to relocate the at least one circuit element so that the connectivity of the circuit with the relocated circuit element is maintained.

The foregoing and/or other aspects and utilities of the present general inventive concept may be also achieved by providing an apparatus to evaluate variants of a circuit design including a database storing circuit data, a user interface through which a user action relocates at least one circuit element across a circuit domain boundary, and an analyzer to determine a value of a circuit parameter of the circuit variant in response to no other user action than the user action to relocate the at least one circuit component.

The foregoing and/or other aspects and utilities of the present general inventive concept may also be achieved by providing a method of evaluating variants. A location across a domain boundary in the circuit design of at least one circuit element is specified through a user action on a user interface. Circuit data is processed to realize the circuit on the medium such that the circuit element remains connected at its previous location across the domain boundary. Circuit data is processed also to generate a model to simulate terminal characteristics of at least a portion of the circuit connected to the circuit element in response to no other action than the user action to specify the location. The terminal characteristics of the portion of the circuit are simulated with the generated model to evaluate a performance criterion of the circuit.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which.

DETAILED DESCRIPTION OF THE PREFERRED EMBODIMENTS

Figure 1:
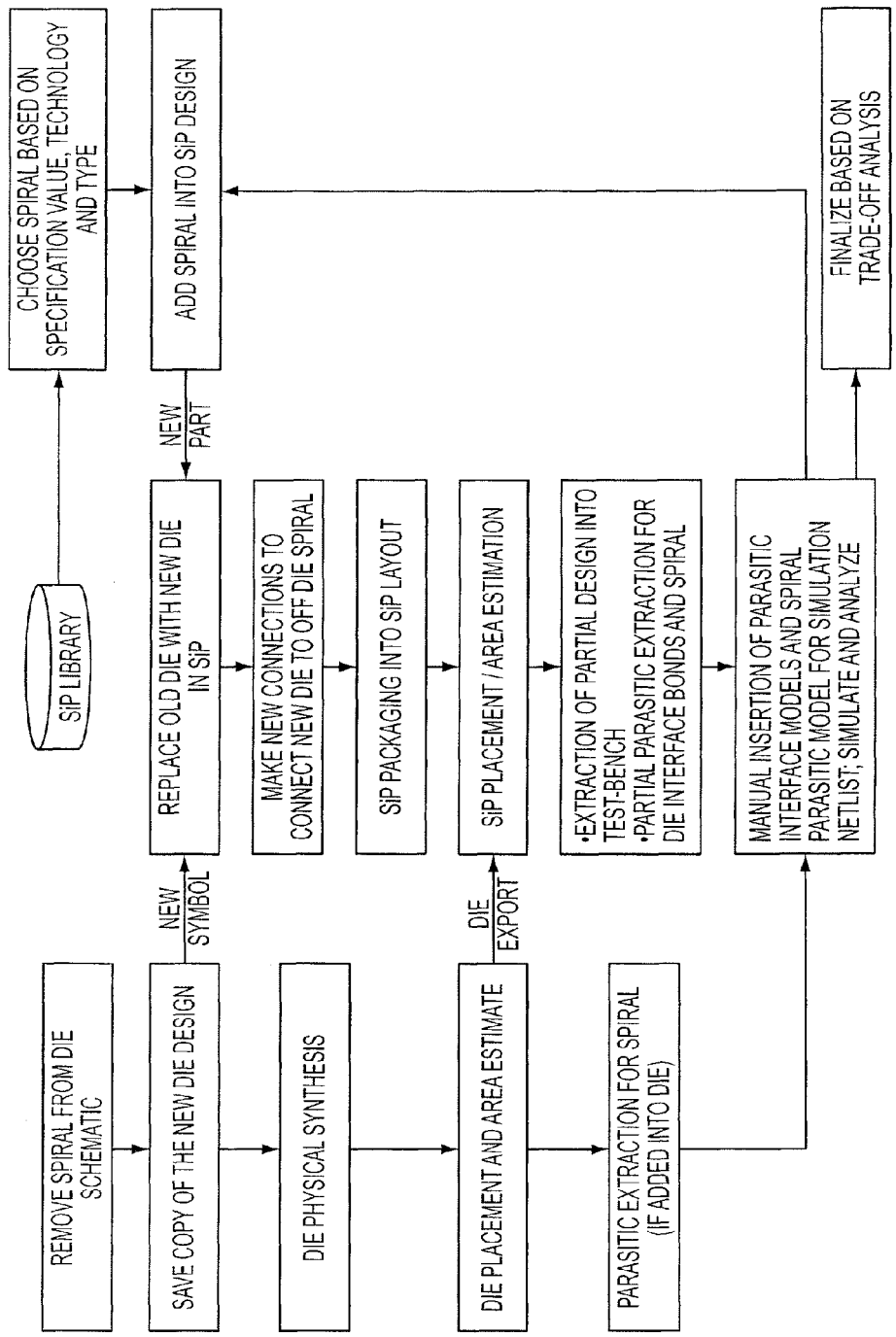
FIG. 1 is a flow diagram illustrating conventional methodology to create and analyze a circuit variant.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2A:
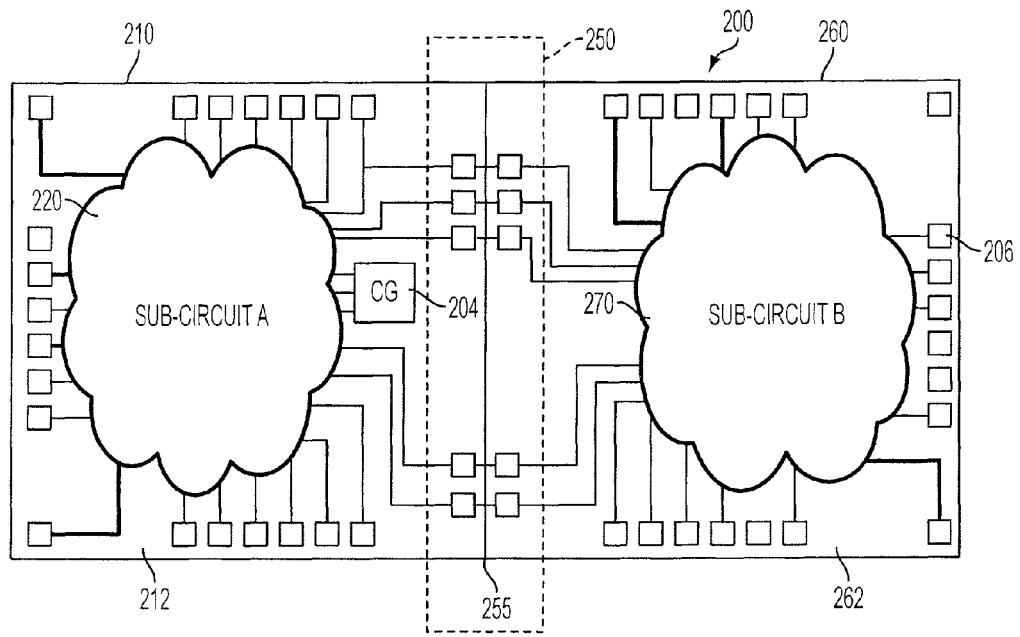
FIGS. 2A-2B are schematic block diagrams illustrating an exemplary circuit configuration by which basic concepts of certain embodiments of the present general inventive concept are described.
Figure 2B:
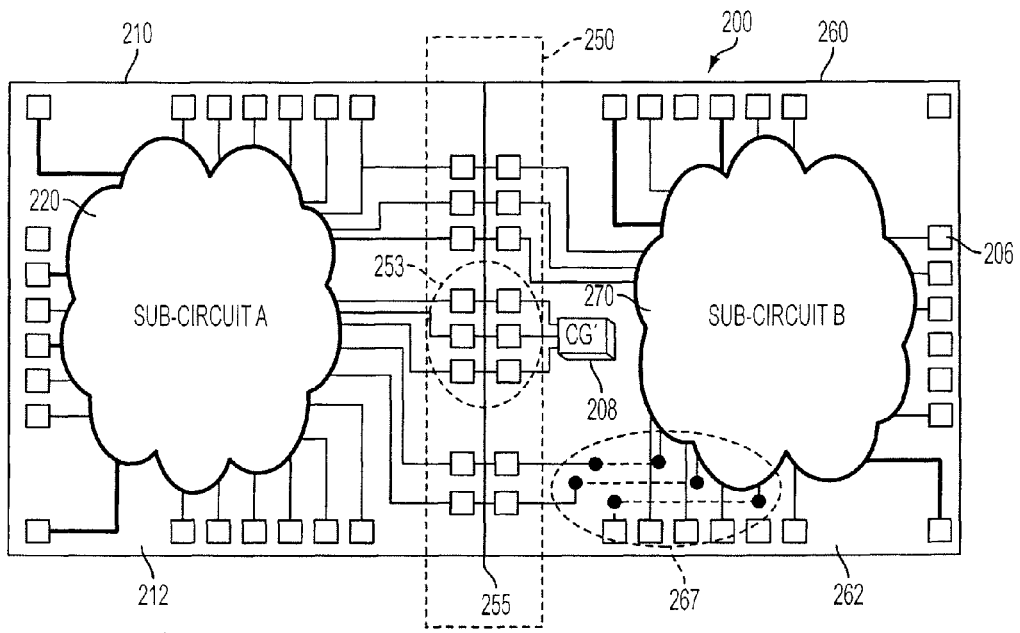

An exemplary circuit configuration 200 is illustrated in FIGS. 2A-2B to define and describe certain basic features of the present general inventive concept. The exemplary circuit 200 may be, for example, a System-in-Package (SiP) as is known in the art, and may be divided into separate circuit domains 210, 260. As used herein, a circuit is a physical realization of circuit elements interconnected in accordance with design specifications, and a circuit element is a physical realization of an electric or electronic circuit component. A net, as used herein, is a collection of terminals, or pins, in the circuit that are to be connected. A circuit domain is a physical division of a circuit into a sub-circuit as assigned by the circuit designer. Circuit domains may be separated according to functionality, implementation or fabrication technology, circuit cost or manufacturing complexity, or other criteria set by the circuit designer. It is to be understood that although only two circuit domains 210, 260 are illustrated in FIGS. 2A-2B, any number of circuit domains can be implemented without deviating from the spirit and intended scope of the present general inventive concept.

A circuit domain includes at least: a) a circuit-bearing medium, such as silicon, low-temperature co-fired ceramic (LTCC), poly(tetrafluoroethene) (PTFE), flame-retardant epoxy resin bonded glass fabric (ERBGF), and other media on which a circuit can be physically realized, and b) a circuit element realized on the circuit-bearing medium. It is to be understood that the same media may be used in separate circuit domains on which corresponding circuit elements are realized. It is to be understood as well that a single net may occupy more than one circuit domain, as will be better understood from the descriptions below. Moreover, although the circuit domains 210, 260 in FIGS. 2A-2B are illustrated as placed side-by-side, such is for purposes of description, and the present general inventive concept is not limited to how the circuit domains are positioned with respect to one another.

In each exemplary circuit domain 210, 260, a corresponding sub-circuit 220, 270 is realized on a corresponding circuit-bearing medium 212, 262. For example, sub-circuit A, illustrated at 220, may be an RF mixed-signal (e.g., including both analog and digital circuit elements) integrated circuit formed on a silicon die, and circuit B, illustrated at 270, may be a controller and support circuit of the circuit A realized on a suitable dielectric printed circuit board material. Each circuit domain 210, 260, may include a plurality of terminals (also referred to herein as pads and pins), representatively illustrated at 206, through which sub-circuits 220 and 270 are interconnected, and through which sub-circuits 220 and 270 are connected to an exterior circuit (not illustrated). The terminals 206 connecting circuit domain 210 with circuit domain 260 are located within an interface region 250 containing a circuit domain boundary 255. The interface region, as used herein, refers to the physical region containing the complete set of terminals establishing electrical continuity between sub-circuits in separate domains across the domain boundary. It is to be understood that while the domain boundary 255 in FIGS. 2A-2B is illustrated as a line, such is for purposes of explanation, and the present general inventive concept is limited neither by the shape of the domain boundary nor by the arrangement of terminals within the interface region. For example, in certain circuit realizations, the circuit domains are stacked one upon another, and the interface region is defined by a plane. In such realizations, the terminals within the interface region may be distributed across the entire plane of the interface region without deviating from the spirit and intended scope of the present general inventive concept.

During the design stage of the circuit 200, it may be advantageous to rapidly analyze variants thereof to determine an optimal balance of design considerations. For example, the designer may seek an optimal balance of specified signal characteristics at a particular output terminal of the circuit versus the circuit cost and implementation overhead or difficulty to produce one circuit variant over another. As illustrated in FIG. 2A, a candidate circuit group 204, which may be a single circuit element or a group of circuit elements, may be targeted by the designer to be moved out of circuit domain 210 and placed into circuit domain 260 so that the impact on the performance of the circuit 200, or even of sub-circuit 220, can be analyzed with the candidate circuit group 204 in circuit domain 260. In accordance with embodiments of the present general inventive concept, the designer can relocate a representation of the candidate circuit group 204, as presented to the designer through a user interface such as that described below, into circuit domain 260.

By way of the action of moving the candidate circuit group, such as through a "drag-and-drop" user action on the user interface, the present general inventive concept executes the necessary data manipulations within a design system operating in accordance with the present general inventive concept so that the circuit variant can be analyzed as to whether the afore-mentioned optimal balance of design considerations can be achieved when the circuit is realized on the circuit-bearing medium. For example, as illustrated in FIG. 2B, a design system consistent with the present general inventive concept, such as described below, may place a set of terminals 253 in the interface region 250 to electrically couple a relocated candidate circuit group 208 (originally candidate circuit group 204) in accordance with its initial connectivity, may route the necessary interconnections from the sub-circuit 220 to the relocated candidate circuit group 208, and may form the relocated candidate circuit group 208 on a circuit-bearing medium 262 in electrical equivalence with the candidate circuit group 204. Additionally, certain embodiments of the present general inventive concept may adjust the area of a circuit-bearing medium 212 by an amount that can be recovered from an area previously occupied by the candidate circuit group 204, and may re-route any interconnections on the circuit bearing medium 262, such as is illustrated at the marked region 267 in FIG. 2B, so as to accommodate the relocated candidate circuit group 208. Further, the present general inventive concept may extract a test circuit from one of the circuit domains 210, 260, and locate appropriate nodes in the test circuit at which to analyze the impact on circuit 200 of moving the candidate circuit group. Any and all of these operations, and others, may be initiated by only the manipulation of the user interface that relocates the candidate circuit group across a circuit domain boundary. Detailed examples of the foregoing and other concepts of the present general inventive concept are illustrated through specific exemplary embodiments described below.

Figure 3A:
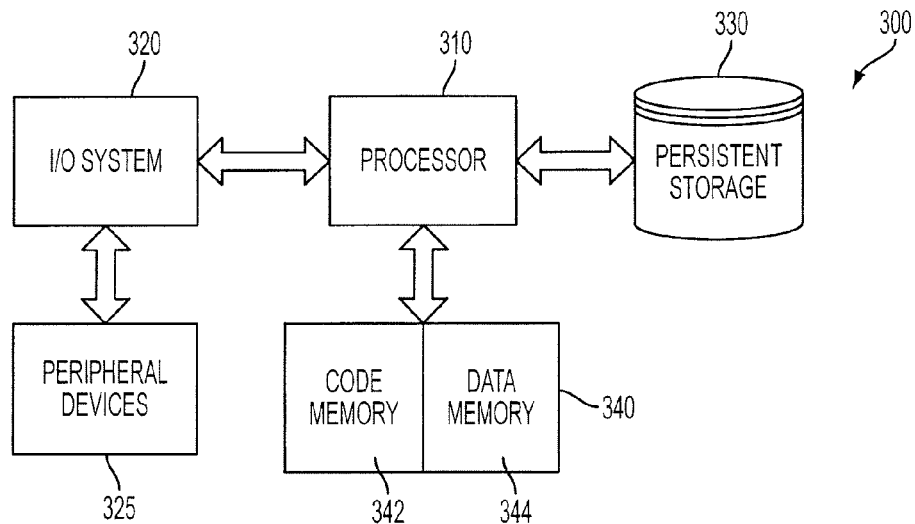
FIG. 3A is a schematic block diagram illustrating an exemplary data processing apparatus suitable to practice embodiments of the present general inventive concept.

FIG. 3A illustrates an exemplary embodiment of a system configuration suitable to practice the present general inventive concept. An exemplary data processing apparatus 300 of FIG. 3A includes an input/output (I/O) system 320, through which the data processing apparatus 300 may communicate with peripheral devices, collectively represented at block 325, and/or with external network devices (not illustrated). The exemplary data processing apparatus 300 of the embodiment illustrated in FIG. 3A includes a processor 310 to direct the interoperation of the components of the data processing apparatus 300, and to execute processing instructions that implement various functional modules, such as those described below with reference to FIG. 3B. Embodiments of the present general inventive concept are not limited to a particular hardware configuration or instruction set architecture of the processor 310, and may be configured by numerous structures that perform equivalently to those illustrated and described herein. Moreover, it is to be understood that while the processor 310 is illustrated as a single component, certain embodiments of the present general inventive concept may include distributed processing implementations through multiple processing elements. The present general inventive concept is intended to embrace all such alternative implementations, and others that will be apparent to the skilled artisan upon review of this disclosure.

A storage unit 340 may be utilized to store data and processing instructions on behalf of the exemplary data processing apparatus 310 of FIG. 3A. The storage unit 340 may include multiple segments, such as a code memory 342 to maintain processor instructions to be executed by the processor 310, and data memory 344 to store data, such as data structures on which the processor 310 performs data manipulation operations. The storage unit 340 may include memory that is distributed across components, to include, among others, a cache memory and a pipeline memory.

The data processing apparatus 300 may include a persistent storage system 330 to store data and processing instructions across processing sessions. The persistent storage system 330 may be implemented in a single persistent memory device, such as a hard disk drive, or may be implemented in multiple persistent memory devices, which may be interconnected by a communication network.

It is to be understood that although the functional compartmentalization of the exemplary embodiment of FIG. 3A facilitates an understanding of the present general inventive concept through descriptions thereof, such configuration is not essential to practice the present general inventive concept.

Elements other than those shown and described may be used in place thereof, functionality portrayed as being carried out in multiple elements may be combined to be carried out in a single component, and elements described as discrete may be distributed across multiple components. Indeed, numerous variations, alternatives and modifications will become apparent to the skilled artisan upon review of this disclosure and the present general inventive concept is intended to encompass such alternative configurations.

Figure 3B:
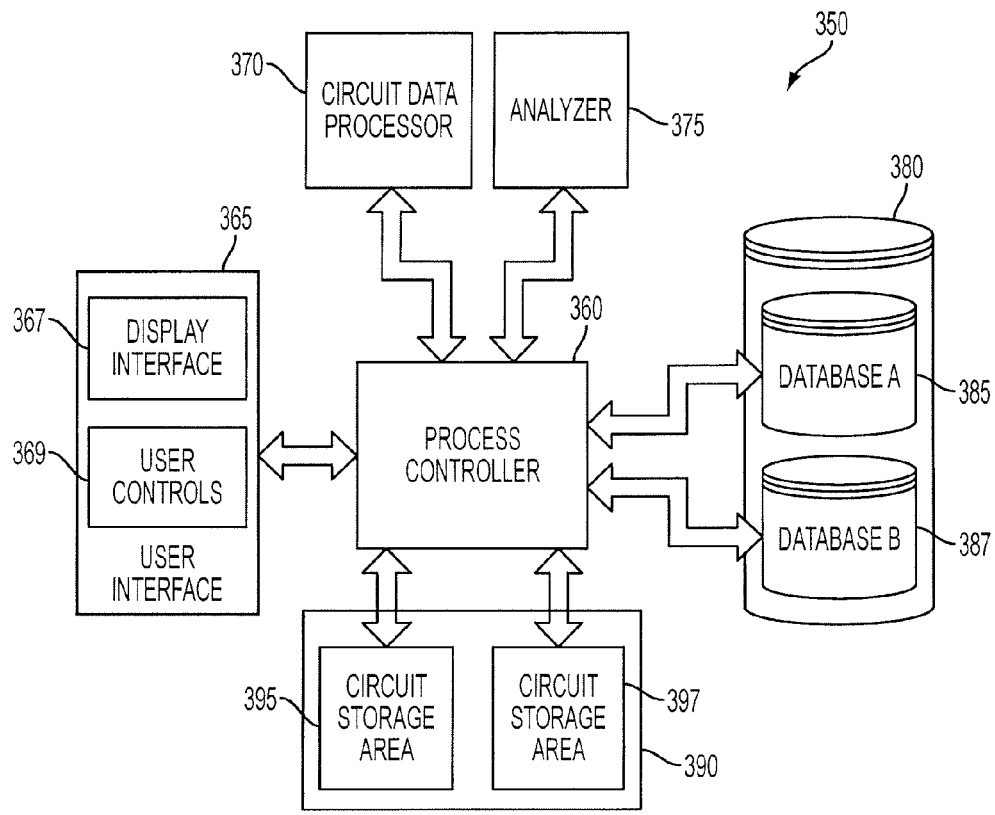
FIG. 3B is a schematic block diagram illustrating an exemplary circuit design system suitable to practice embodiments of the present general inventive concept.

FIG. 3B illustrates an exemplary configuration of functional components suitable to practice certain embodiments of the present general inventive concept. The exemplary system illustrated in FIG. 3B may be implemented through processing instructions executed on the processor 310, and in cooperation with other components as illustrated in FIG. 3A, form an exemplary circuit test design and analysis system (CDAS) 350 on the exemplary data processing apparatus 300. The exemplary CDAS 350 may be operated by a circuit designer to design and analyze circuit design variants and to provide circuit realization data in accordance with the circuit variant that is selected by the designer. The realization data may include data formatted to physically fabricate the circuit on one or more circuit-bearing media, such as data to construct component and interconnect mask patterns, component placement location data, packaging data, and any other data necessary in a fabrication process to produce the finished circuit product. The present general inventive concept is not limited by any particular fabrication process, and any suitable fabrication data format may be used with the present general inventive concept without deviating from the spirit and intended scope thereof.

The CDAS 350 may include a process controller 360 to coordinate and control the interoperations of the functional components of the CDAS 350 so as to achieve a fully operational data processing system. For example, the process controller 360 may receive data corresponding to user manipulations of the user interface 365 (to be described below), may format the data into a command and/or data location in memory, and may convey such information to the applicable functional module of the CDAS 350. The process controller 360 may subsequently receive processed data from the applicable functional module and forward the data to another functional module, as well as to indicate such processing on the user interface 365. The process controller 360 will perform other coordination and control operations according to the implementation of the CDAS 350, and such other operations, as well as the implementation of such, can be embodied by a wide range of well-known process control methods and apparatuses. The present general inventive concept is intended to encompass all such alternatives of the process controller 360, including multi-threaded and distributed process control methodologies.

As indicated above, the CDAS 350 may include a user interface 365 through which the CDAS 350 interacts with a user thereof, typically a circuit designer. The peripheral devices 325 may include a display unit (not illustrated) and one or more Human Interface Devices (HIDs; not illustrated), such as a mouse, a track ball, a stylus, a touch screen, and/or a touchpad, among others. The combination of hardware devices and suitably programmed processing instructions executed by the processor 310 form the user interface 365. The user interface 365 is used in certain embodiments of the present general inventive concept to present data to the user in a meaningful form on a display interface 367, such as through images of circuit schematics, circuit layout diagrams, circuit test bench interfaces, data management interfaces such as file directories, and other images recognized by the user.

The user interface 365 may also interpret user manipulations of any HIDs thereof into messages and instructions that can be recognized by the process controller 360. The user interface 365 may include a plurality of user controls 369 to afford the user interactivity with and control over the CDAS 350. The user controls may include the HIDs described above, and may also include software implemented controls on the display interface 367, such as buttons, menus of commands, text command entry blocks, and other suitable software controls. The foregoing description of the user interface 365 may be met by a suitably configured graphical user interface (GUI), the implementation details of such will be omitted for the sake of providing a concise description of the general inventive concept.

The CDAS 350 may include a database 380 of circuit objects that maintain all the data necessary to design, analyze, modify, and fabricate a circuit per the specifications of the designer. As used herein, a circuit object is a data structure that can be stored in a memory device to contain data of a circuit element so that the circuit element can be viewed, modified, interconnected with other circuit elements, and analyzed in one or more circuit design contexts selected by a user. Such may be achieved by a suitable data abstraction technique so that a particular circuit element may be, for example, presented as a schematic symbol in a schematic entry design context, presented as a footprint in a layout design context, presented as a routing component in a circuit routing design context, and provided as a component model in a circuit analysis and design verification context. A circuit object may also be hierarchical, whereby a circuit object contains other circuit objects of circuit elements interconnected to form a component that has a schematic symbol, layout footprint, and a terminal characteristics model used as a single element in a circuit. An example of such a circuit object is that of an operational amplifier. It is to be understood that in the descriptions below, unless otherwise made clear to the contrary, operations described below as being performed on a circuit element implies the operation being performed on the containing circuit object by the components of the CDAS 350.

It is to be understood that interconnection components, such as terminal pads, wires, conductive traces and segments thereof, inter-layer vias, and ground planes, among others, are considered circuit elements per the definition given above, and may be contained in a corresponding circuit object in memory. Moreover, circuit-bearing media are also circuit components that may be contained in a circuit object. Accordingly, a circuit designer may construct a sub-circuit on a circuit-bearing medium of, for example, LTCC and then place the LTCC circuit on a circuit-bearing medium of, for example, ERGBF. The designer may select the circuit-bearing medium in a manner similar to selecting any other circuit element.

Database 380 may have formed therein a plurality of databases, such as illustrated by database A 385 and database B 387, to respectively maintain circuit data corresponding to respective circuit-bearing media. For example, database A 385 may contain circuit objects of circuit elements to be realized on silicon, and database B 387 may contain circuit objects of circuit elements to be realized on LTCC. Accordingly, a circuit object in database A 385 of a 4.7 mH inductor may contain data to produce mask patterns to form a conductive spiral in silicon having an inductance of 4.7 mH. On the other hand, a circuit object of the 4.7 mH inductor in database B 387 may contain data to form a conductive spiral on LTCC having an inductance of 4.7 mH. The skilled artisan will recognize that although the two inductors may have ideally the same inductance, the terminal characteristics of each inductor may be substantially different due to the respective construction of each. It is to be understood that while only two databases, database A 385 and database B 387 are illustrated in FIG. 3B, the present general inventive concept is intended to implement as many databases as may be required to realize circuitry on the different circuit-bearing media types of the different sub-circuits in a particular circuit design. For example, in addition to the databases A and B described above, a third database may be established to maintain circuit objects for PTFE, and yet another database may contain circuit objects for ERGBF. It is to be understood also, that while the databases A and B are illustrated as separate entities, the present general inventive concept is not so limited. For example, a single database may contain circuit objects that maintain data of a circuit element in addition to the realization and model data for all of the different circuit-bearing media in the circuit.

The circuit objects in database A 385 and database B 387, and any other database, may also include data suitable to model parasitic behavior of a circuit element to account for non-ideal terminal characteristics of individual components, and to account for characteristics of unavoidable mechanical transitions in the circuit. For example, referring back to FIG. 2A-2B, the interface region 250 containing the terminals by which the sub-circuits 220 and 270 are interconnected has associated therewith the parasitic capacitance, resistance, and inductance caused by the mechanical connections required to make the electrical connections. A parasitic model is inserted so that the circuit can be accurately simulated. The parasitic model may be included as data in the circuit object of the circuit element to which it applies and/or the parasitic model may be inserted into the circuit as a separate circuit element contained in its own circuit object. The present general inventive concept is not limited by the implementation of the parasitic model.

Circuit storage area 390 is a work space in memory, such as in data memory 344, in which to store circuit instances. As used herein, a circuit instance is a data structure in memory containing all of the circuit objects necessary to view, modify, analyze, and evaluate a circuit or sub-circuit. The circuit storage area 390 may be segmented into circuit storage areas 395 and 397 to be utilized as required to meet a design objective. For example, the circuit storage area 395 may have stored therein a circuit instance and the circuit storage area 397 may have stored therein a variant of the circuit stored in circuit storage area 395. Alternatively, circuit storage area 395 may contain a variant of a circuit and circuit storage area 397 may contain a test circuit extracted from the circuit variant to evaluate that variant, as will be described below. It is to be understood that although only two circuit storage areas are illustrated in FIG. 3B, any number of such storage areas may be used to provide the intended purposes as described herein without deviating from the spirit and intended scope of the present general inventive concept. Additionally, the circuit storage areas may be defined as static memory structures, or may be allocated dynamically as needed. The present general inventive concept is not limited to particular implementations of the circuit storage areas.

As illustrated in FIG. 3B, CDAS 350 may include a circuit data processor 370 to execute the operations necessary to form circuit instances from circuit objects and to modify the circuit instances in accordance with instructions and data obtained from and provided by the process controller 360. The circuit data processor 370 may implement many design functions including, but not limited to, circuit layout generation and modification, topological and geometrical routing and autorouting, schematic diagram entry and modification, test circuit extraction, and fabrication mask data generation and modification. The present general inventive concept is not limited by a particular implementation of any of the circuit data processing functions of the circuit data processor 370, and any suitable function may be used with the present general inventive concept without deviating from the spirit and intended scope thereof. The circuit data processing functions to carry out the present general inventive concept will be described below as applicable; otherwise the implementation details thereof will be omitted for the sake of providing a concise description of the general inventive concept.

The exemplary CDAS 350 includes an analyzer 375 that produces analytical data obtained from simulations of a circuit under test (CUT), which may be, for example, a variant of a circuit or a test circuit extracted from the circuit variant, as described below. The analyzer 375 may implement many analytical functions including, but not limited to, signal analysis, manufacturing cost analysis, and fabrication difficulty analysis. The present general inventive concept is not limited to a particular implementation of any of the analysis functions of the analyzer 375, and any suitable function that performs the intended purpose as described herein may be used with the present general inventive concept without deviating from the spirit and intended scope thereof. Certain features of the analyzer 375 and the analysis functions to carry out the present general inventive concept will be described below as applicable; otherwise the implementation details thereof will be omitted for the sake of providing a concise description of the general inventive concept.

A circuit design may be modified by moving a circuit element from one circuit domain to another, such as illustrated in FIG. 2A-2B, by way of a user manipulation of user controls 367 of the user interface 365. In the interest of succinctness, a user manipulation of a user control 367 will be referred to herein as a user control action, which includes typing a command on a keyboard to enter a text command, clicking on a software button to execute a corresponding command, and the drag-and-drop operation, whereby a user selects an item with a mouse click, moves the item by holding down the mouse button and moving the mouse in the direction in which the selected item is to be moved, and placing the item in the new location by releasing the mouse button, double-clicking an item to perform a command on the item, and other such actions. Additionally, a user control action that moves a circuit element to a new location in the design will be referred to herein as a user move action.

When a circuit element, or group of elements, is moved from one domain to another, a change in at least one circuit variant metric occurs. As used herein, a circuit variant metric is a circuit parameter suitable to measure the benefit and/or detriment of moving the circuit element, such as a change in the area of the circuit-bearing medium on one or both sides of the domain boundary, a change in the performance of the circuit, as measured by, for example, simulated signal-to-noise ratio, and other parameters that are of interest to evaluate the circuit variant created by the move. In accordance with the present general inventive concept, in response to a user move action that results in a circuit element, or group of elements, to cross a circuit domain boundary, the circuit design is altered so that the relocation of the circuit element can be physically realized on circuit-bearing media on which the boundary is defined, and at least one circuit variant metric is presented to the user. That is, the user need only to manipulate a user control to indicate to the CDAS 350 that a candidate circuit group has crossed a domain boundary, and the necessary design changes to realize the circuit are implemented without further user action, and at least one circuit parameter suitable to at least partially evaluate the impact of the change may also reported without further user action.

Portions of the CDAS 350 may be implemented by a suitable Electronic Design Automation (EDA) system having similar features as those described above. The present general inventive concept may be practiced by an existing EDA system having the novel features described herein incorporated therein. Such incorporation may be carried out by altering the program code of the EDA system, or may be incorporated as a functional module to interact with an existing EDA system through, for example, an Application Programming Interface (API), or other such mechanism.

In the paragraphs that follow, the present general inventive concept will be further described and explained through specific exemplary embodiments thereof. It is to be understood that although operations below are described as though graphic manipulations are occurring, such as moving an element on the display of the user interface, such is for description purposes, and the underlying operations that are performed by coordinated processes of the circuit design system 350 are implied, as would be appreciated by the ordinarily skilled artisan.

For purposes of illustration and not limitation, a radio-frequency System-in-Package (RF-SiP) will exemplify the circuit of interest, a radio-frequency System-on-a-Chip (RF-SoC) will exemplify a sub-circuit A, and a circuit to support the RF-SiP formed on LTCC will exemplify sub-circuit B. In the interest of succinctness, RF-SoC sub-circuit will be referred to as the DIE circuit, even though the silicon circuit-bearing medium may contain more than one sub-circuit, in the DIE circuit domain and the sub-circuitry formed on the LTCC will be referred to the LTCC circuit, even though the LTCC circuit-bearing medium may contain more than one sub-circuit, in the LTCC domain. An inductor in the DIE circuit will exemplify the candidate circuit group being moved, and the circuit variant to be considered is the RF-SiP with the inductor relocated to the LTCC domain. Whereas the exemplary embodiment presently described and described below are directed towards RF-SiP designs, the general inventive concept can be readily extended to other circuit configurations and applications, as will be recognized by the ordinarily skilled artisan upon review of the present disclosure.

Figure 4:
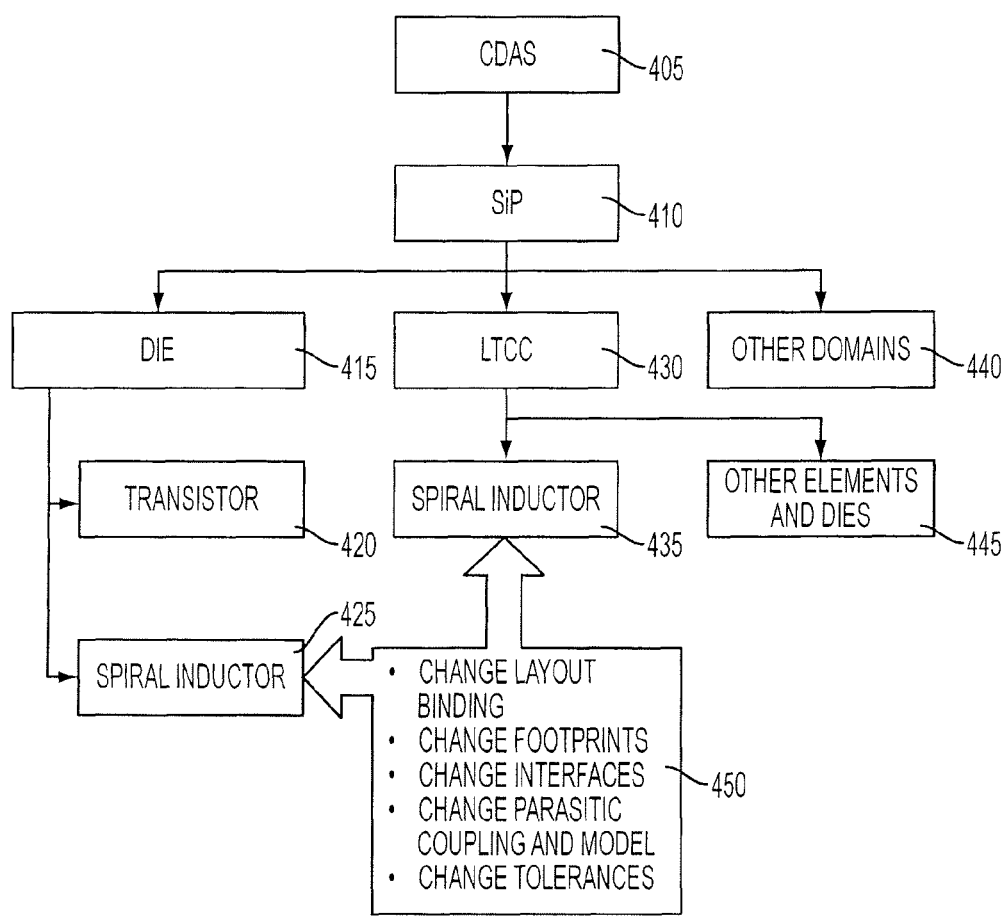
FIG. 4 is a diagram illustrating an exemplary methodology to relocate components in accordance with embodiments of the present general inventive concept.

FIG. 4 illustrates an exemplary data hierarchy for providing an overview of functionality of exemplary embodiments of the present general inventive concept. CDAS block 405 represents at the highest level of the hierarchy the totality of the design system's functions to enter, view, modify, analyze, and evaluate one or more circuit designs, such as the RF-SiP presently exemplified. The SiP block 410 represents the totality of the RF-SiP design, and includes all of the circuit objects of the circuit elements forming the RF-SiP. The SiP 410 includes the circuit domains of the DIE, represented by the DIE block 415, the LTCC, represented by LTCC block 430, and other domains, represented at block 440 as established by the designer in the RF-SiP design 410. Each of the domains 415, 430, and 440 are defined by a domain boundary encompassing all of the circuit elements on the corresponding circuit-bearing medium. In certain embodiments of the present general inventive concept, a representation of the domain boundary is displayed, such as on the display 367, and its location and extent may be maintained in one or more circuit objects, such as the circuit object of the circuit-bearing medium, and/or a circuit object of the boundary itself and/or as an entry in a circuit object containing the SiP circuit data.

Each domain 415, 430, 440 includes all of the circuit objects of the circuit elements therein. For example, as illustrated in FIG. 4, the exemplary DIE domain 415 includes transistor circuit objects, which contain the data so that the corresponding transistor can be, among other things, viewed on the display interface through one or more representations thereof, modeled and analyzed through circuit simulations, and realized on the silicon circuit-bearing medium. In addition to other circuit objects, the exemplary DIE domain 415 includes a spiral inductor circuit object 425 of a spiral inductor, which contains the data so that the inductor may be viewed on the display interface through one or more representations thereof, modeled and analyzed through circuit simulations, and realized on the silicon circuit-bearing medium.

Similar to the DIE domain, the LTCC domain 430 may include circuit objects of various circuit elements and circuits on dies as represented by block 445. Additionally, the LTCC domain 430 may include a circuit object 435 of an inductor having the same value of inductance as the inductor in circuit object 425, but with the data to be modeled and analyzed based on its construction on LTCC, and data to realize the inductor on LTCC. An inductor realized in silicon may be of a different physical size and have different terminal characteristics as an inductor realized on LTCC or another circuit-bearing medium, and it is these differences that can be readily evaluated by the various embodiments of the present general inventive concept.

Certain embodiments of the present general inventive concept implement a push/pull device, as illustrated at block 450, which affords a designer the capability to push circuit elements onto one circuit-bearing medium, for example, the silicon medium of the DIE domain, from another circuit-bearing medium, for example, the LTCC medium, and to pull a circuit element in the reverse direction. Such action further allows reverting back to a previous variant in which the candidate circuit group back is placed onto the medium from which it was pulled or pushed. As illustrated in block 450, the push/pull device of the present general inventive concept performs a plurality of operations in response to no other action than to move the circuit element in one direction or the other across the domain boundary. It is to be understood that operations in addition to and other than those illustrated in FIG. 4 and described below may be implemented without deviating from the spirit and scope of the present general inventive concept, as will be recognized by the ordinarily skilled artisan upon review of this disclosure.

Figure 5A:
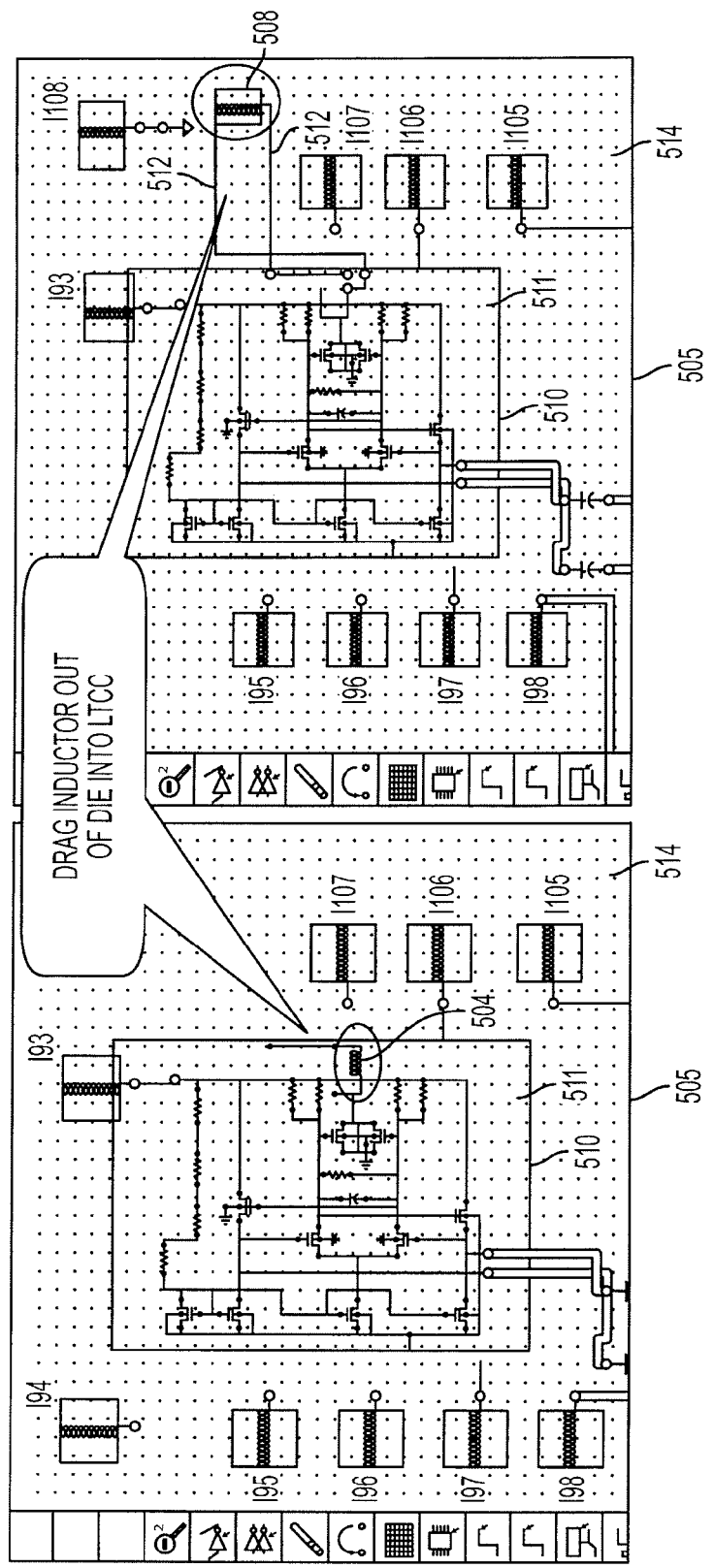
FIGS. 5A-5C are illustrations of portions an exemplary user interface to describe component moving operations thereon in accordance with embodiments of the present general inventive concept.

Referring to FIG. 5A, there is illustrated an exemplary user interface display 505 on which a designer may execute a user move action. In the illustrated example, a DIE domain 511 is enclosed by a DIE domain boundary 510, and the circuitry external to the DIE domain boundary 510 is in an LTCC circuit domain 514. Through a drag-and-drop operation, for example, the designer may pull an inductor 504 from the DIE domain 511 into the LTCC domain 514. The relocated inductor may be replaced, or swapped with, for example, an inductor 508, as described below, and the connectivity of the inductor 508 is maintained through connections 512. It is to be understood that the connections 512 indicate only connectivity, and may not be in the configuration of a physical connection on the circuit bearing media. In certain embodiments of the present general inventive concept, the circuit data processor 370 may forestall routing the connections 512 until the acceptance of the design variant by designer. However, if processing capability of an embodied CDAS 350 permits rapid routing operations, such routing may be initiated upon the inductor 508 being placed, so that the variant may also be evaluated in terms of design rule checks (DRCs).

In certain embodiments of the present general inventive concept, the layout binding of the candidate circuit group, in this case the inductor 508, may be changed to be accommodated in the layout of the target domain. This operation may be achieved by associating a circuit object in one database, such as database 385, with one or more circuit objects of electrically equivalent circuit elements in another database, such as database 387. The association may be achieved by any suitable technique, such as including a reference to the circuit objects of any electrically equivalent circuit elements as a data field in the circuit objects themselves.

In certain embodiments of the present general inventive concept, as the designer pulls the inductor from the DIE through, for example, a drag-and-drop user move action, the user interface displays the representation of the inductor in an alternative graphic once it has crossed the circuit domain boundary. Prior to the designer releasing the button on the HID on which the drag-and-drop user move action is being performed, the designer may select from any of the electrically equivalent circuit elements through, for example, another button on the HID. For example, if the HID is a mouse, the drag-and-drop user move action may be performed by selecting the inductor with a left button and holding down the left button as the inductor is being "dragged" to its new location. Once the designer has dragged the inductor across the domain boundary, the designer may then activate the right button by, for example, the well-known, "right-click" mouse operation, to select one of the associated electrically equivalent circuit elements. Such selection of alternatives may be accomplished by any suitable technique, such as by presenting to the designer a context menu of all the electrically equivalent components upon a single press of the right button, or may be accomplished by cycling through the associated electrically equivalent circuit elements each time the right button is pressed. Once the designer has selected the desired equivalent element, the designer may release the left button to "drop" the element into the target circuit domain. It is to be understood that other user move actions may be performed to relocate the electrical component, and other techniques to present the electrically equivalent circuit elements may also be implemented without deviating from the spirit and intended scope of the present general inventive concept.

Figure 5B:
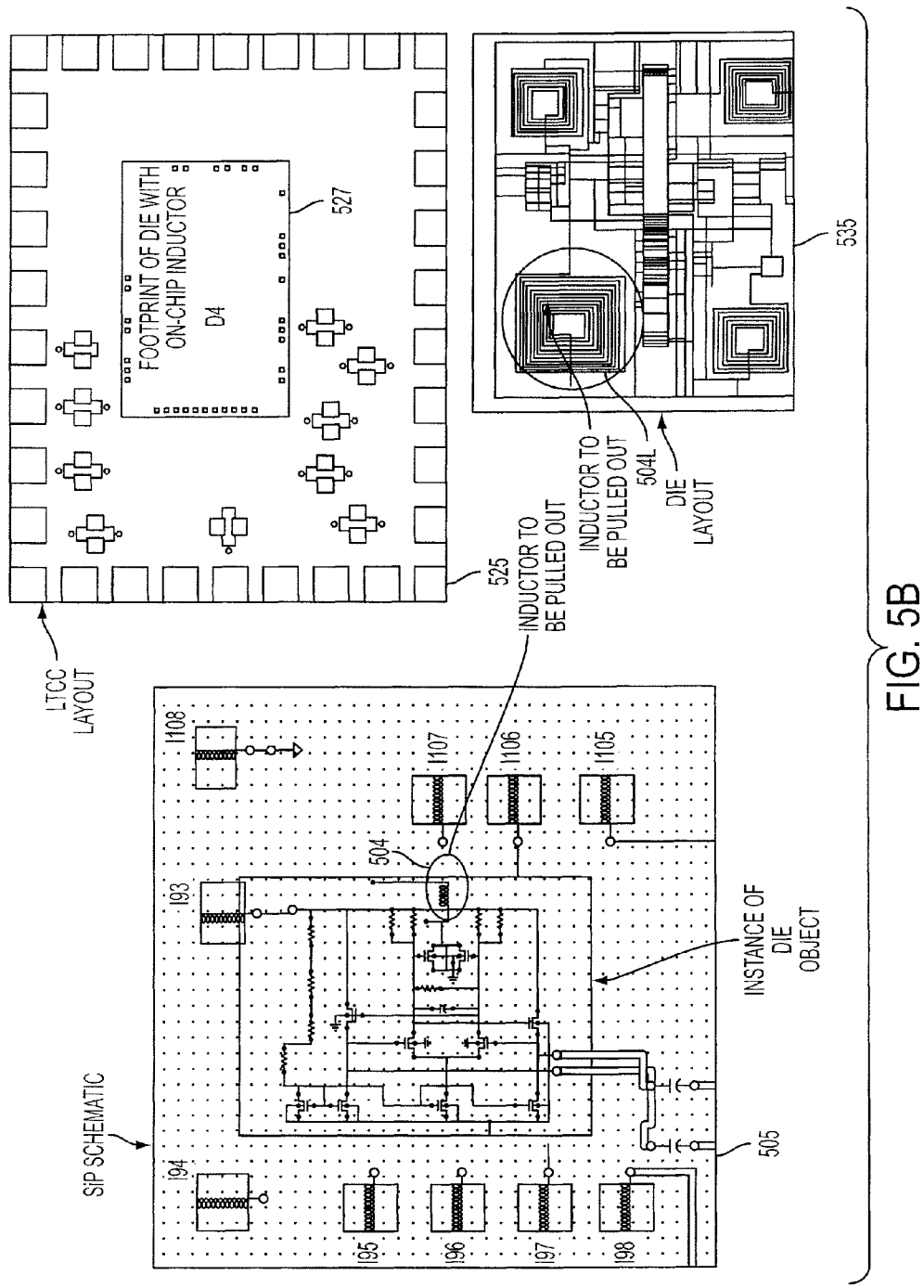
Figure 5C:
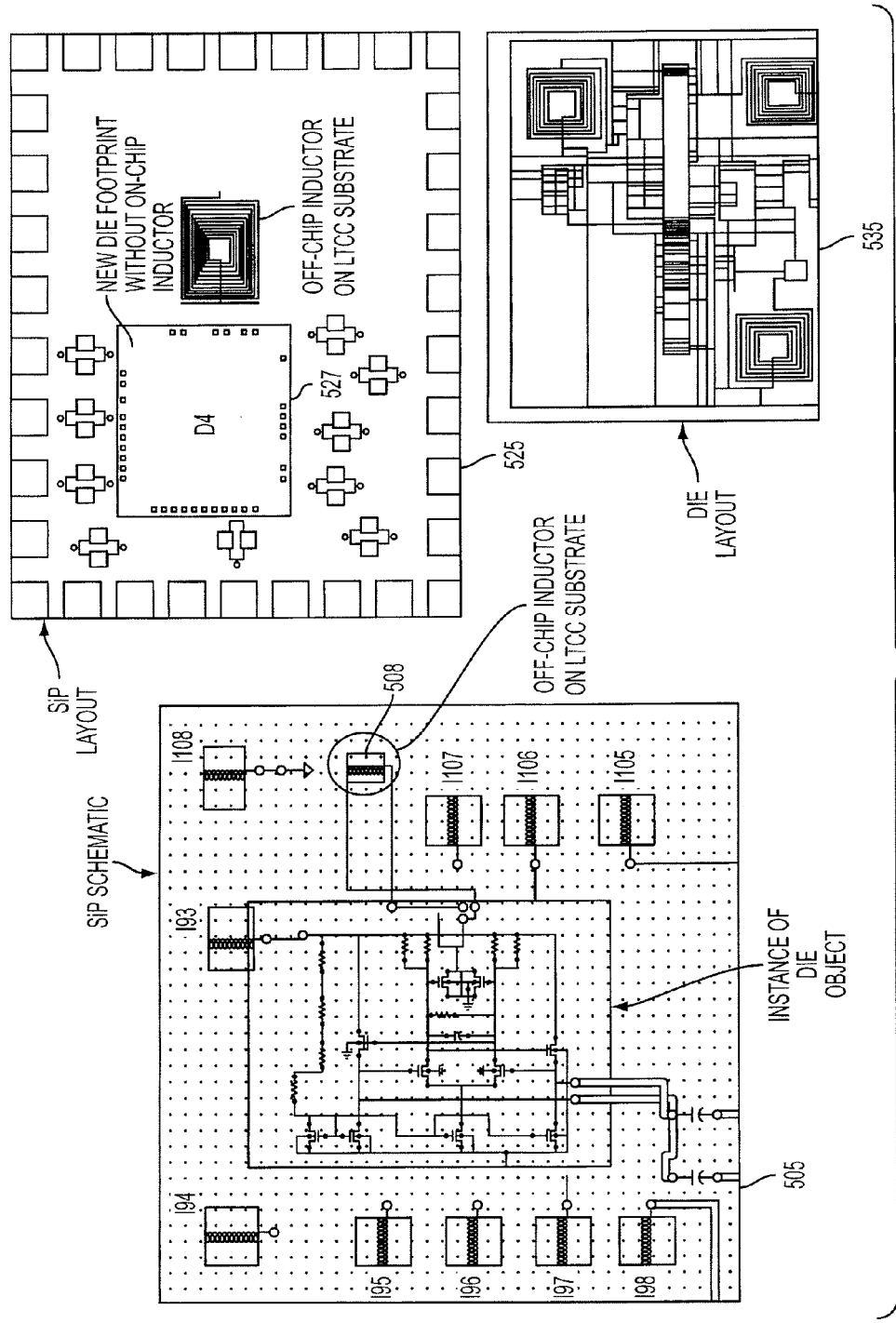

The push/pull device 450 may also change component footprints in the design in response to no other user action than the user move action to relocate the candidate user group. FIG. 5B illustrates different views of a user interface prior to relocating inductor 504. View 505 is the previously described schematic view, view 525 is the layout interface of the LTCC circuit-bearing medium, and view 535 is the layout interface of the DIE circuit-bearing medium. As can be readily observed from the figure, the inductor 504 occupies a predefined area of the DIE medium as indicated at 504L. The area of the inductor on the DIE medium defines, at least in part, the footprint 527 of the DIE on the LTCC circuit-bearing medium. FIG. 5C illustrates the same views 505, 525 and 535 with the inductor moved to the LTCC domain. As is illustrated, the footprint of the DIE is smaller and the area occupied on the LTCC circuit-bearing medium is larger. This change in footprint may be presented to the designer seamlessly through no other user action than the user move action that relocated the inductor into the LTCC domain.

The push/pull device 450 may also change the interface between circuit domains in accordance with the relocation of the candidate circuit group without any other action than the user move action. In the present example, since the inductor is being moved off of the DIE circuit-bearing medium and onto the LTCC circuit-bearing medium, electrical continuity must be established between the DIE circuit and the inductor on the LTCC medium. Thus, when the inductor has crossed the circuit domain boundary, an indication of such may be provided to the circuit data processor 370, such as by a signal or an interprocess message. Once the inductor has been placed or re-placed, the circuit data processor 370 may create instances of circuit objects containing interconnection pads, and may then insert the pads into the design on each side of the circuit domain boundary as is illustrated in FIGS. 2A-2B. The circuit data processor 370 of FIG. 3B may then execute an autorouting function to construct the interconnections between the DIE circuit and the inductor through the interconnection pads, where the interconnections may be stored in one or more circuit objects in each of the domain databases. If the inductor is being moved onto the DIE medium from the LTCC medium, the interconnection pads and the associated interconnecting conductor paths would be removed, and the autorouter may perform routing on the DIE medium as needed.

The push/pull device 450 of the present general inventive concept may also modify the parasitic coupling and terminal characteristics model according to the new location of the candidate circuit group. As stated above, the inductor realized on the LTCC medium will have different terminal characteristics than when realized on silicon, which is one motivating factor in exploring the feasibility of the circuit variant. However, the interconnection pads and interconnecting paths introduce non-ideal circuit behavior by way of their mechanical construction. The present general inventive concept may modify the circuit accordingly without any other user action than the user move action to relocate the candidate circuit group. In certain embodiments of the present general inventive concept, the circuit objects of circuit elements have stored therein data from which a simulation model may be constructed, which includes parasitic coupling data. The model data may be provided to the analyzer 375 with which circuit functional simulations are executed and analyzed, such as described further below.

The push/pull device 450 of the present general inventive concept may also change the constraints and tolerances assigned to the candidate circuit group to correspond to the circuit construction of the target circuit-bearing medium. For example, a spacing constraint between conductive paths on silicon may be 2 microns, whereas the spacing constraint on an LTCC substrate may be 10 microns. Thus, the appropriate constraints are provided to the circuit data processor 370 so that the inductor is constructed on the LTCC substrate within the tolerances specified for that medium.

As is illustrated in FIG. 4 and the description thereof, multiple circuit modifications may be incorporated into the SiP design without any other user action on the user interface than the user move action to move the candidate circuit group. In certain embodiments of the present general inventive concept, a circuit variant is created by copying one of the domains into a circuit storage area 390, 395 so that an original of the domain can thereby be preserved. A change history of each variant may be stored in memory, and any variant can be converted back to a previous version by, for example, a user selection of a menu item providing the available versions. The present general inventive concept is not limited by the storage of circuit variants, and other techniques may be used to provide rapid conversion between versions of circuit variants. The present general inventive concept is intended to encompass all such variations thereof.

To evaluate circuit variants, the present general inventive concept further provides seamless analysis tools so that the trade-offs between, for example, circuit performance and circuit cost can be properly weighed. In certain embodiments of the present general inventive concept, at least one circuit parameter that can be used to evaluate the trade-off is presented to the designer by no other user action than the user move action that created the variant. For example, as described above, the impact of the DIE footprint on the area of the LTCC circuit-bearing medium may be presented to the designer responsive to the drag-and-drop operation on the user interface. This, as well as other circuit parameters, may be presented solely by the user move action and no other user action on the user interface 365.

Figure 6:
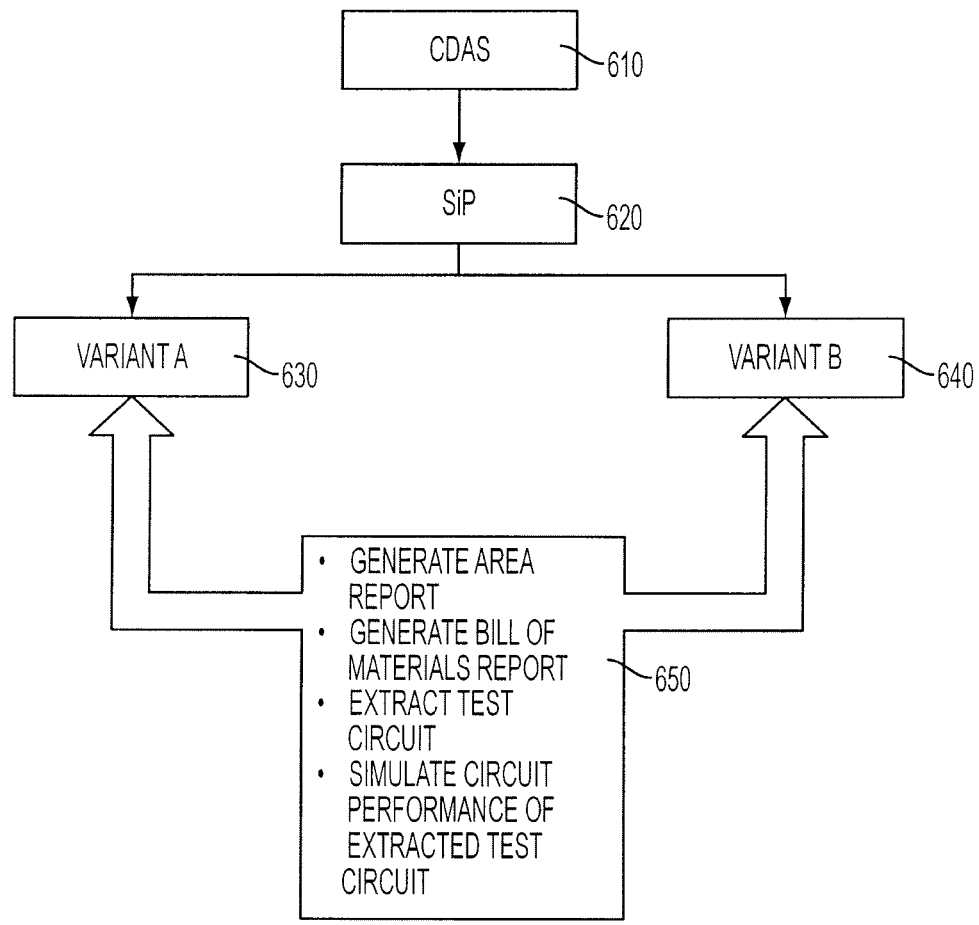
FIG. 6 is a diagram illustrating an exemplary methodology to analyze circuit variants in accordance with embodiments of the present general inventive concept.

In FIG. 6, a hierarchical block diagram is illustrated to describe exemplary analysis features of the present general inventive concept. Blocks 610 and 620 encompass the totality of the design system and the SiP circuit, respectively, as in the hierarchy described with regard to FIG. 4. The SiP circuit 620 may be embodied in any one of a wide range of variants, two of which are illustrated at blocks 630 and 640. In the example of FIG. 4, only two variants 630 and 640 are illustrated, although the present general inventive concept is not limited to the number of variants being concurrently evaluated. Each of the variants 630, 640 may be stored in a separate workspace in memory, such as in circuit storage areas 395, 397 illustrated in FIG. 3. The variants 630 and 640 may be evaluated, such as illustrated by evaluation block 650, to determine which is optimal with respect to the designer's criteria.

As stated above, one or more parameters by which a variant may be evaluated is generated without any further user action on the user interface than the user move action that defined the circuit variant. To this end, for example, the user move action may trigger the generation of a signal or interprocess message to the circuit data processor 370 to calculate the areas of the circuit-bearing media, and to report the area calculations to the designer. In certain embodiments of the present general inventive concept, the area is presented as a ratio of the area of a circuit-bearing medium in the most recently created variant to the area of the circuit-bearing medium of a previous variant. Other such reports, such as the Bill of Materials report indicated in block 650 may be generated in a manner similar to the area report. The general inventive concept is not limited to the content and format of such reports, and various levels of detail therein may be implemented without deviating from the spirit and intended scope of the present general inventive concept.

In addition to reporting the changes in physical construction attributes of a circuit variant, the present general inventive concept may extract a test circuit suitable to evaluate the performance of the variant, and execute circuit simulations using only the extracted test circuit, as is illustrated in block 650. When so embodied, the present general inventive concept advantageously circumvents time consuming circuit simulation and analysis of the entire design.

Figure 7:
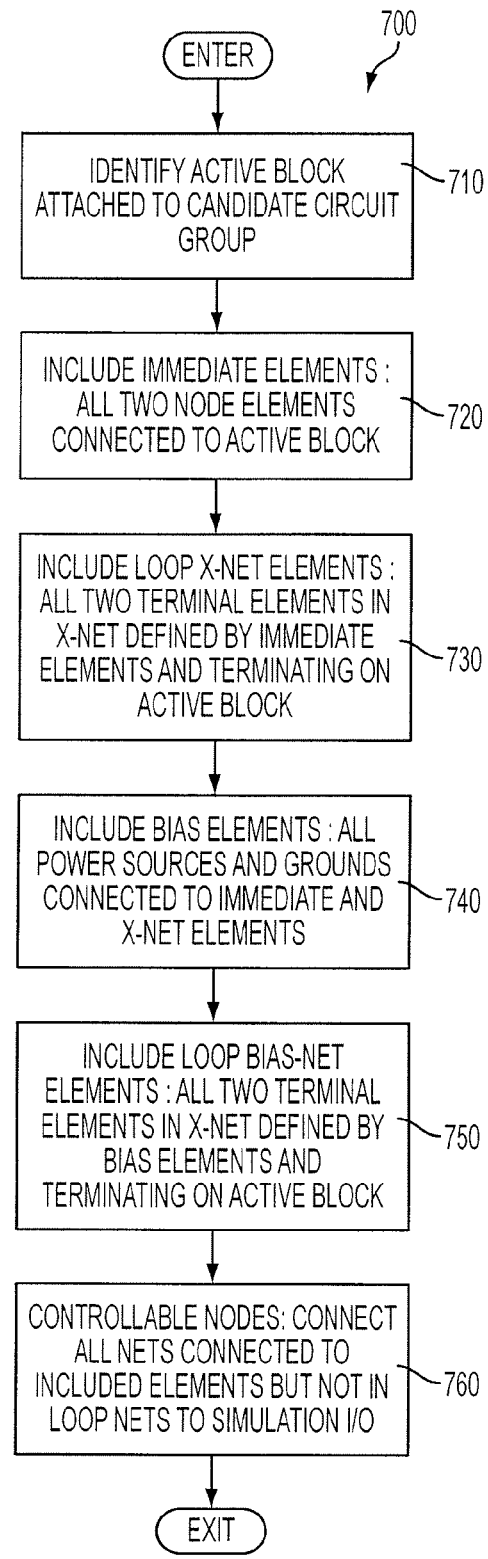
FIG. 7 is a flow diagram illustrating an exemplary process to extract a test circuit from a circuit variant in accordance with embodiments of the present general inventive concept.
Figure 8A:
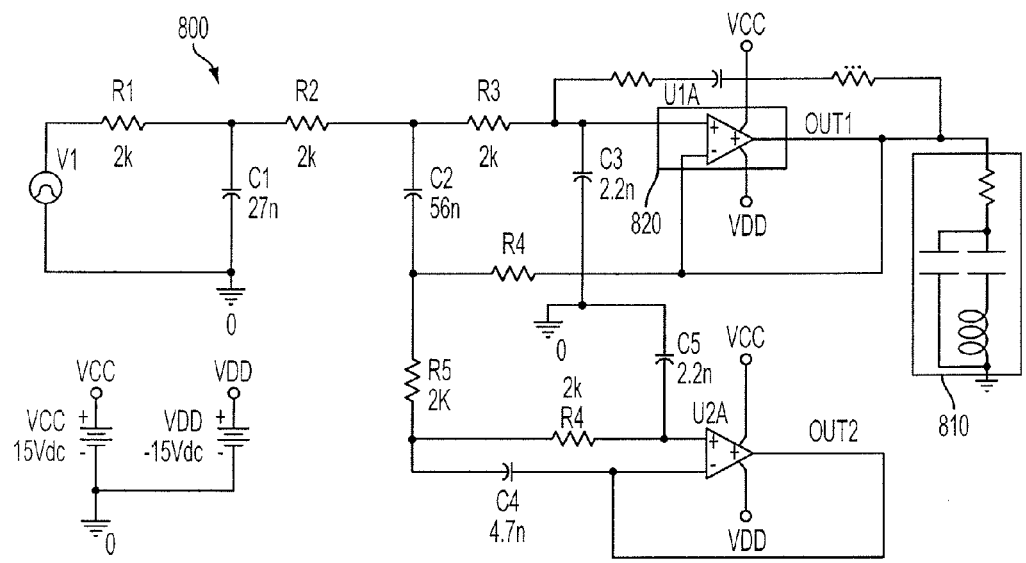
FIGS. 8A-8F are illustrations of portions of an exemplary schematic diagram to describe analysis circuit extraction operations in accordance with embodiments of the present general inventive concept.
Figure 8B:
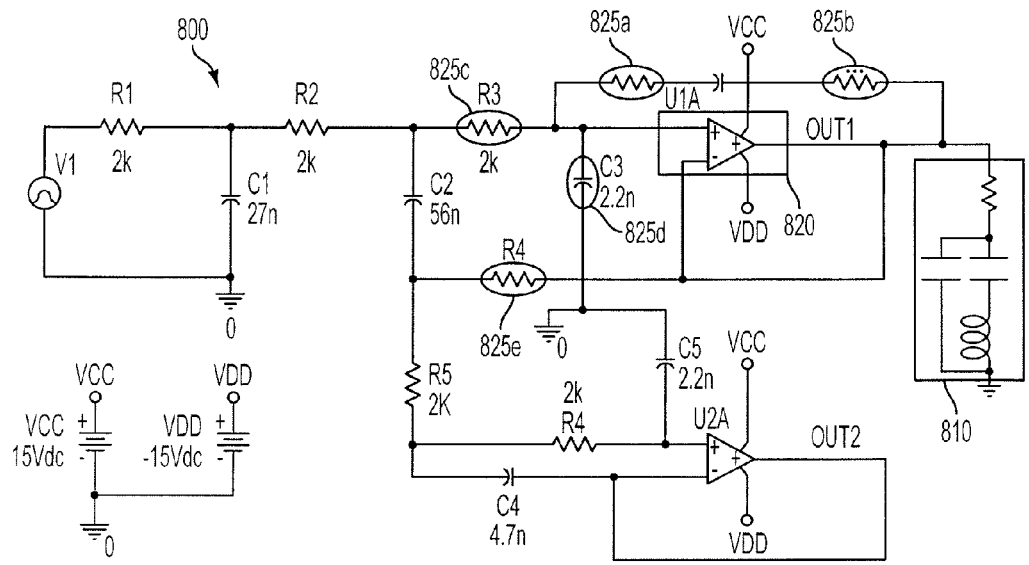

In FIG. 7, there is illustrated an exemplary test circuit extraction process 700 to be described in conjunction with the schematic diagrams of FIGS. 8A-8F. Referring first to FIG. 8A, there is illustrated a schematic diagram of a portion of a circuit variant 800 connected at an output thereof to a load model 810. The load model 810 incorporates the inductor with the parasitic elements associated with, for example, the interconnections with the DIE circuit through terminal pads and wire segments. It is to be understood that the present general inventive concept is not limited to the particular model used to simulate the behavior of the relocated candidate circuit group, and that the load model 810 is simplified.

Additionally, while the load model 810 is illustrated in FIGS. 8A-8E to depict an exemplary parasitic model of a relocated inductor, certain embodiments of the present general inventive concept disregard the structure of the model in the test circuit extraction process. Accordingly, the load model 810 will be referred to simply as the inductor 810 in the exemplary test extraction process 700 described below. Moreover, although the description below is provided with reference to the schematic diagrams of FIGS. 8A-8F, the test circuit extraction process 700 may be performed on circuit objects in the database 380 and/or in circuit storage areas 395, 397 without the circuit variant being rendered as an image on the display 367.

In operation 710, the active block connected to the candidate circuit group is identified. Such is illustrated in FIG. 8A, where the amplifier in block 820 is the active circuit element driving the inductor 810. The active block 820 may be identified responsive to the user move action that relocates the inductor 810. As described above, a signal or interprocess message may be provided to the process controller 360 once the candidate circuit group has crossed the applicable domain boundary. Consequently, through no other user action on the user interface 365 than the user move action that relocates the candidate circuit group, the operations of process 700 may be executed.

Figure 8C:
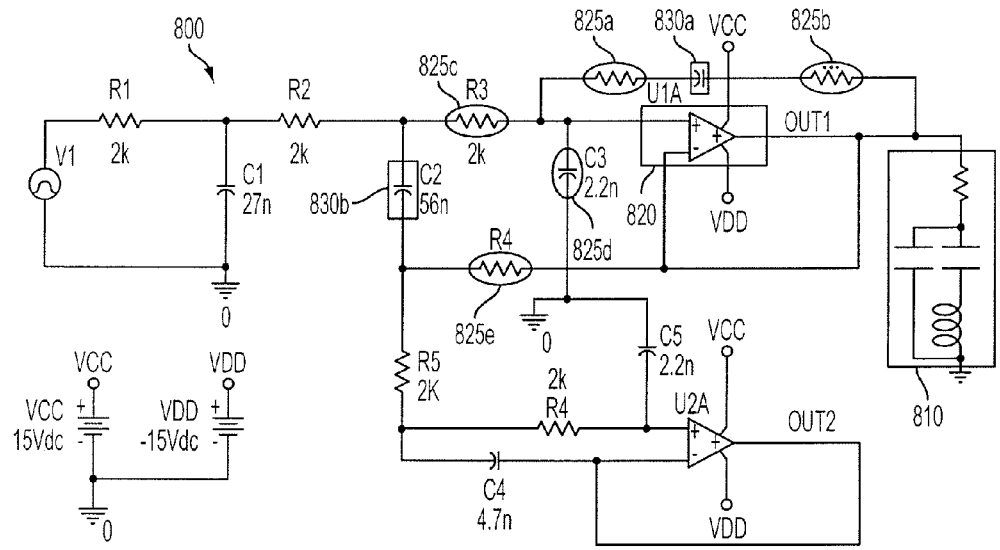
Figure 8D:
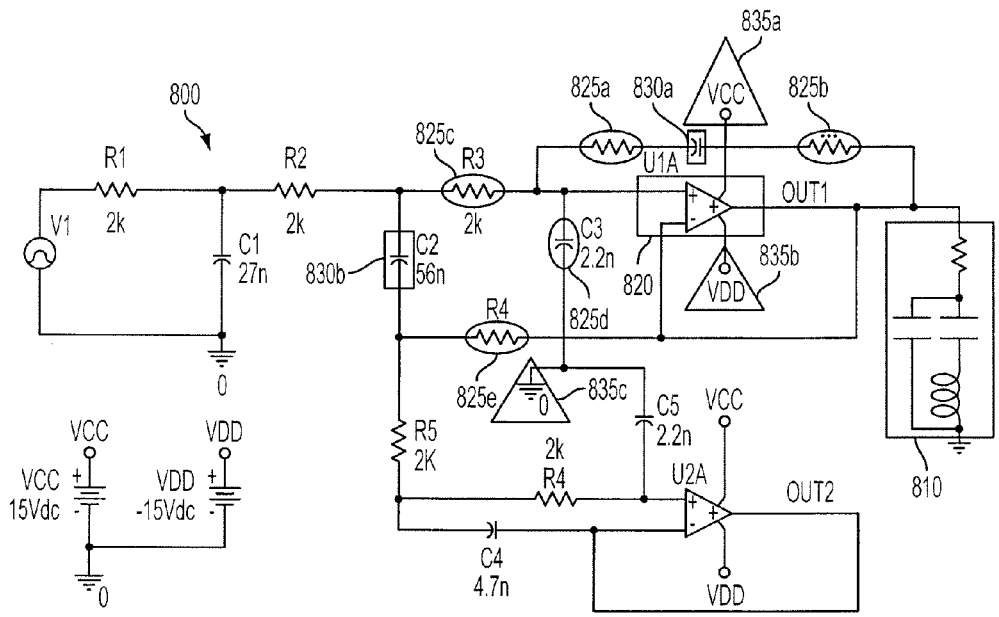

Once the active block has been identified in operation 710, process 700 transitions to operation 720, whereby the two-terminal circuit elements terminating on the active block 820, referred to herein as "immediate elements," are selected to be included in the test circuit. The immediate elements 825a-825e are illustrated in the ovals in FIG. 8B. The process 700 proceeds to operation 730, whereby the circuit elements in the loop X-net defined by the immediate elements 825a-825e are selected. A loop X-net is a net starting at one node in the circuit and completing a loop at another node in the circuit, in this case a node on the active block 820. Accordingly, the loop X-net circuit elements 830a-830b in the loop defined by the immediate elements 825a-825e are illustrated in the rectangles of FIG. 8C.

Figure 8E:
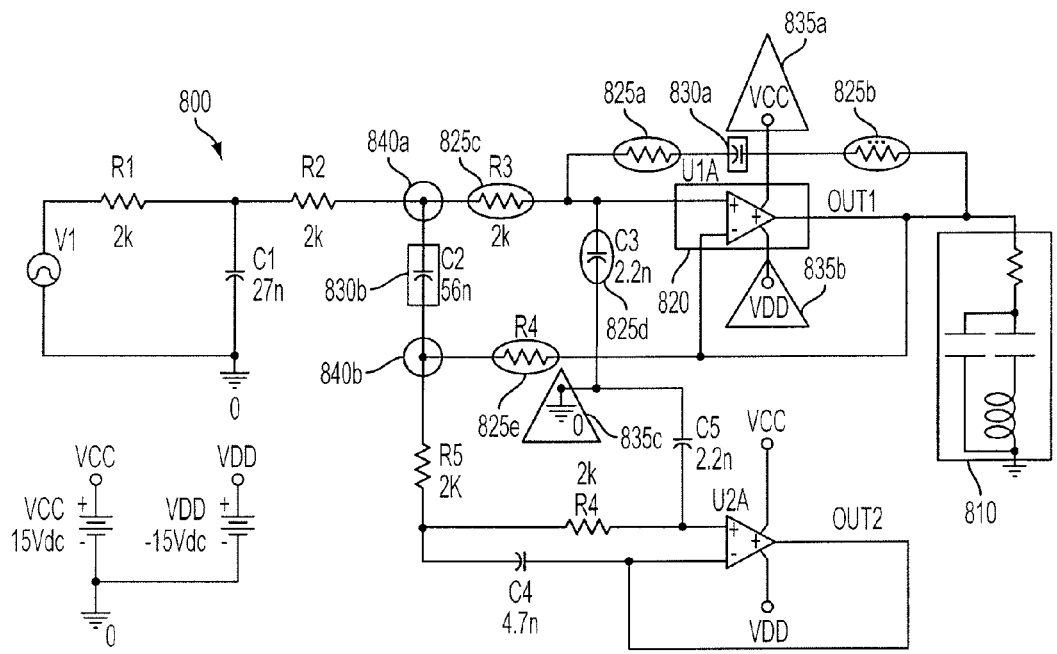
Figure 8F:
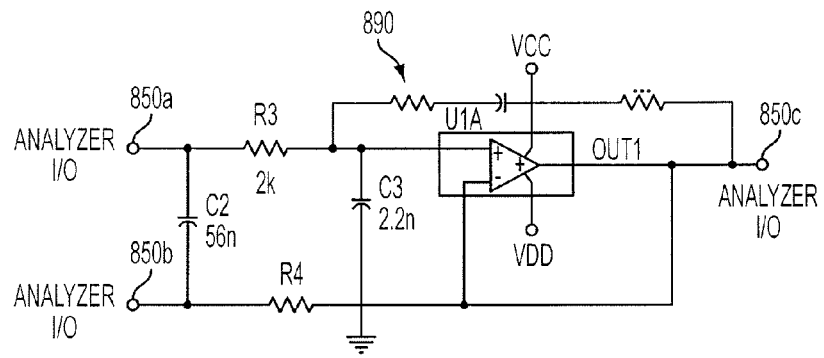

As illustrated in FIG. 7, the test circuit extraction process 700 transitions to operation 740, whereby all of the bias elements connected to the immediate elements 825a-825e and the loop X-net elements 830a-830b are selected to be included in the test circuit. The bias elements include the power sources and the ground nodes, such as the power nodes 835a and 835b, and the ground node 835c, illustrated in the triangles of FIG. 8D. In operation 750, any two terminal circuit elements that are in the X-net defined by the bias net are included in the test circuit. This may include any bypass capacitors, which have been omitted from FIGS. 8A-8F to avoid congesting the diagram. In operation 760, the controllable nodes are identified as those nodes of nets connecting the included elements other than the loop net elements. The extracted test circuit 890 is illustrated in FIG. 8E, with the controllable nodes 850a-850c being connected to the analyzer I/O for performance analysis of the circuit variant.

In certain embodiments of the present general inventive concept, the circuit objects containing the test circuit 890, as extracted by no other user action on the user interface 365 than the user move action, are provided to the analyzer 375 to perform circuit simulation thereon. For example, the circuit objects of the extracted test circuit 890 may include a hardware description language (HDL) model, or similar component abstraction that defines the functional behavior of the test circuit 890, which may then be used to simulate a wide variety of conditions, such as changes in quality factor resulting from moving a candidate circuit group across a domain boundary, and parasitic loading of the test circuit 890 caused by the connections across a domain boundary. The present general inventive concept is not limited by specific analysis techniques, and many different analyses and circuit simulations may employed by the analyzer 375 to evaluate a circuit variant without departing from the spirit and intended scope of the present general inventive concept.

Figure 9:
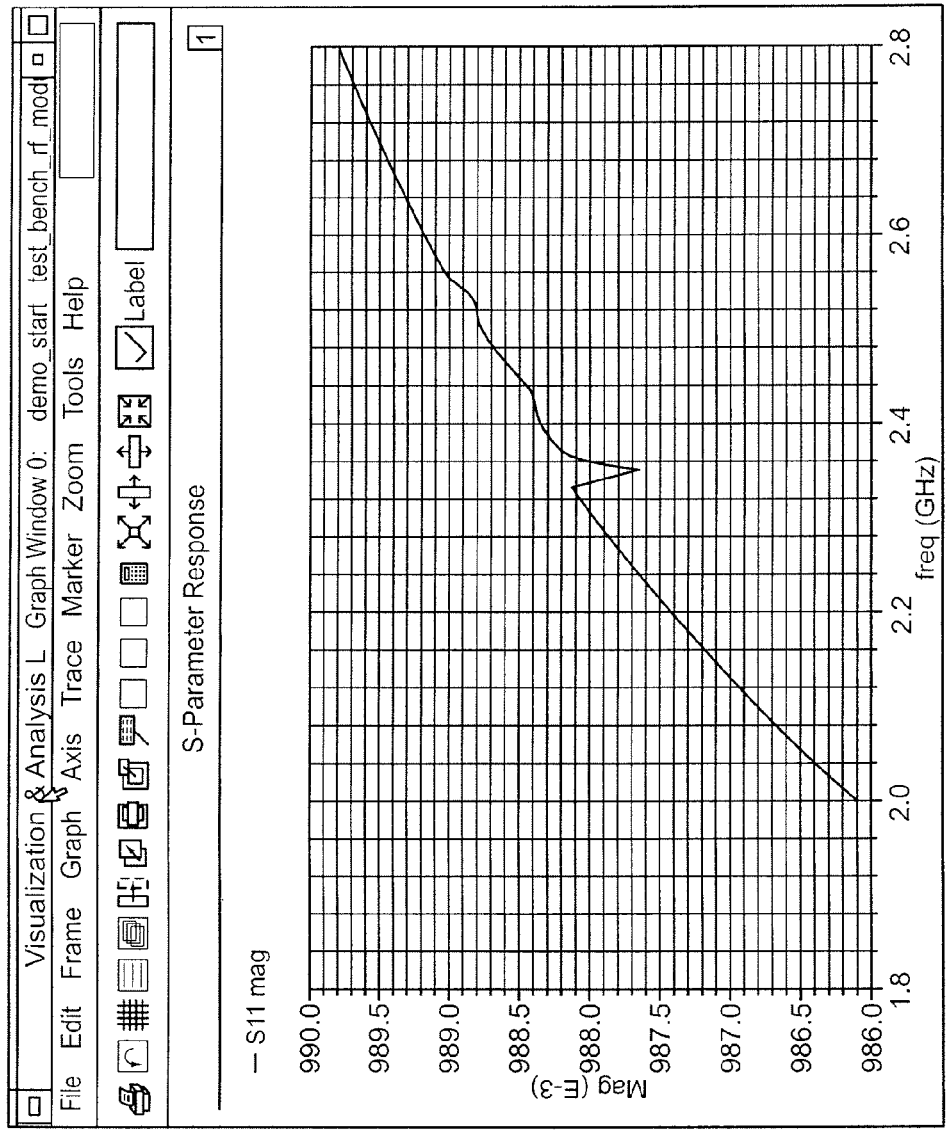
FIG. 9 is an illustration of exemplary test data presented in a user interface in accordance with embodiments of the present general inventive concept.

The graph illustrated in FIG. 9 is an exemplary output of the analyzer 375, which may be displayed on the display interface 367 of user interface 365. The illustrated example of FIG. 9 is a magnitude plot of the scattering parameter $S_{11}$, indicative of the voltage reflection coefficient corresponding to the input port of test circuit 890, formed from controllable nodes 850a-850b, under a load of, for example, the inductor 810 with parasitic loading corresponding to interconnections across a silicon/LTCC domain boundary. The exemplary simulation results indicate an impedance mismatch between 2.26 GHz and 2.68 GHz, and the designer can readily view this condition and determine if such mismatch is acceptable. If the mismatch is not acceptable to the designer, foe example, the original circuit may be re-established as the selected design or a new circuit variant may be formed and evaluated.

In certain embodiments of the present general inventive concept, the output graph illustrated in FIG. 9 may be displayed on the user interface 365 responsive to no other user action thereon than the user move action. Moreover, one or more of the views illustrated in FIGS. 5A-5C and FIG. 9, as well as others, may be displayed concurrently in response to only the user move action, such as through multiple windows in a windowed graphical user interface.

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the medium.

It is to be understood that the computer-readable medium described above may be any medium on which the instructions may be encoded and then subsequently retrieved, decoded and executed by a processor, including electrical, magnetic and optical storage devices, and wired, wireless, optical and acoustical communication channels. The computer readable medium may include either or both of persistent storage, referred to herein as "computer-readable recording media" and as spatiotemporal storage, referred to herein as "computer-readable transmission media". Examples of computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The computer-readable recording media may be distributed across components, to include such distribution through storage systems interconnected through a communication network. The computer-readable transmission media may transmit encoded instructions on electromagnetic carrier waves or signals, or as acoustic signals through acoustically transmissive media. Moreover, the processor instructions may be derived from algorithmic constructions of the present general inventive concept in various programming languages, the mere contemplation of which illustrates the numerous realizable abstractions of the present general inventive concept.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalence.

What is claimed is:

1. An apparatus to evaluate variants of a circuit design comprising:
   a database having stored therein circuit data representing an electronic circuit design including a plurality of interconnected circuit elements on at least one circuit-bearing portion;
   a user interface for actuating a user action to relocate at least one circuit element across a circuit domain boundary defined on the circuit-bearing portion to produce a circuit variant; and
   an analyzer operable to determine operational response of a test circuit modeling a portion of the electronic circuit design corresponding to the circuit variant, the test circuit being generated by a circuit data processor upon the user interface receiving a user action to relocate the at least one circuit element across the circuit domain boundary, wherein the test circuit is used in evaluating the circuit variant.

2. The apparatus as recited in claim 1, wherein the analyzer determines a value of a circuit parameter in response to no other user action on the user interface than the user action of relocating the at least one circuit element.

3. The apparatus as recited in claim 1 further comprising:
   a circuit data processor to extract test circuit data from the circuit data in response to the user action to relocate the at least one circuit element, the test circuit data including data of circuit elements fewer in number than the circuit elements of the electronic circuit design.

4. The apparatus as recited in claim 3, wherein the circuit data processor extracts as the test circuit an active circuit to which the at least one circuit element is connected, immediate elements connected to the active circuit, loop elements connected in loop nets defined by the immediate elements, bias elements connected to the active elements, the immediate elements and the loop elements, and bias loop elements connected in loop nets defined by the bias elements.

5. The apparatus as recited in claim 4, wherein the circuit data processor determines controllable nodes as nodes that connect all nets connected to the extracted elements exclusive of the elements in the loop nets, the controllable nodes being connected to the analyzer.

6. The apparatus as recited in claim 3, wherein the circuit data processor modifies the circuit data so that circuit connectivity with the relocated circuit element is maintained in response to the user action to relocate the at least one circuit element.

7. The apparatus as recited in claim 6, wherein the circuit data processor modifies the circuit data in response to no other user action on the user interface than the user action to relocate the at least one circuit element.

8. The apparatus as recited in claim 1, wherein the electronic circuit design includes a plurality of sub-circuits defined respectively within a plurality of circuit domains separated one from the other by the circuit domain boundary.

9. The apparatus as recited in claim 8, wherein the plurality of sub-circuit are disposed respectively on circuit bearing portions of different material type.

\* \* \* \* \*

UNITED STATES PATENT AND TRADEMARK OFFICE
CERTIFICATE OF CORRECTION

PATENT NO. : 8,645,894 B1  Page 1 of 1
APPLICATION NO. : 12/166730
DATED : February 4, 2014
INVENTOR(S) : Taranjit Singh Kukal, Amit Chopra and Raja Mitra It is certified that error appears in the above-identified patent and that said Letters Patent is hereby corrected as shown below:

On the Title Page

Please amend the Third Inventor's name found on Page 1, Line 7, item (75) as follows:
Replace "Raja Vitra" with "Raja Mitra".

Signed and Sealed this
Twenty-seventh Day of May, 2014

Michelle K. Lee
*Deputy Director of the United States Patent and Trademark Office*